(12) United States Patent
Marotta et al.

(10) Patent No.: US 6,898,131 B2
(45) Date of Patent: May 24, 2005

(54) VOLTAGE AND TEMPERATURE COMPENSATED PULSE GENERATOR

(75) Inventors: Giulio G. Marotta, Via Fontecerro Sud (IT); Tommaso Vali, Via Fanfara (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/932,858

(22) Filed: Sep. 2, 2004

(65) Prior Publication Data

US 2005/0024951 A1 Feb. 3, 2005

Related U.S. Application Data

(60) Continuation of application No. 10/642,958, filed on Aug. 18, 2003, now Pat. No. 6,807,111, which is a division of application No. 10/032,277, filed on Dec. 21, 2001, now Pat. No. 6,643,192.

(30) Foreign Application Priority Data

Dec. 28, 2000  (IT) .................................... RM2000A0700

(51) Int. Cl.[7] .............................................. G11C 16/04
(52) U.S. Cl. .................................. 365/189.09; 365/211
(58) Field of Search ........................... 365/189.09, 211, 365/189.11; 327/511, 512

(56) References Cited

U.S. PATENT DOCUMENTS

| | | | |
|---|---|---|---|
| 5,373,227 A | 12/1994 | Keeth | |
| 5,545,983 A | 8/1996 | Okeya | |
| 5,644,538 A | 7/1997 | Merritt | |
| 5,650,966 A | 7/1997 | Cleveland | |
| 5,659,264 A | 8/1997 | Ariyoshi | |
| 5,835,422 A | 11/1998 | Merritt | |
| 5,864,504 A | 1/1999 | Tanzawa | |
| 5,959,485 A | 9/1999 | Roohparvar | |
| 6,087,876 A | 7/2000 | Barrow | |
| 6,163,225 A | * 12/2000 | Sundaram et al. | 331/57 |
| 6,269,026 B1 | 7/2001 | Venkatesh et al. | |
| 6,452,437 B1 | 9/2002 | Takeuchi et al. | |
| 6,765,372 B2 | * 7/2004 | Isham | 323/224 |

* cited by examiner

*Primary Examiner*—Anh Phung
(74) *Attorney, Agent, or Firm*—Leffert Jay & Polglaze PA; Thomas W. Leffert

(57) ABSTRACT

Ramp comparator pulse generators having temperature and voltage compensation are adapted for use in integrated circuit devices such as memory devices. Such pulse generators include a ramp signal generator, a threshold signal generator, and a comparator providing an output signal in response to a difference between the potential level of the threshold signal and the potential level of the ramp signal. The pulse generators described herein utilize an adaptive threshold signal generator configured as a voltage divider and having resistive components having differing effective temperature coefficients of resistivity. The adaptive threshold signal generator has an upper resistive component and a lower resistive component coupled in series between a high potential node and a low potential node. The lower resistive component has an effective temperature coefficient of resistivity that is less than an effective temperature coefficient of resistivity of the upper resistive component.

25 Claims, 5 Drawing Sheets

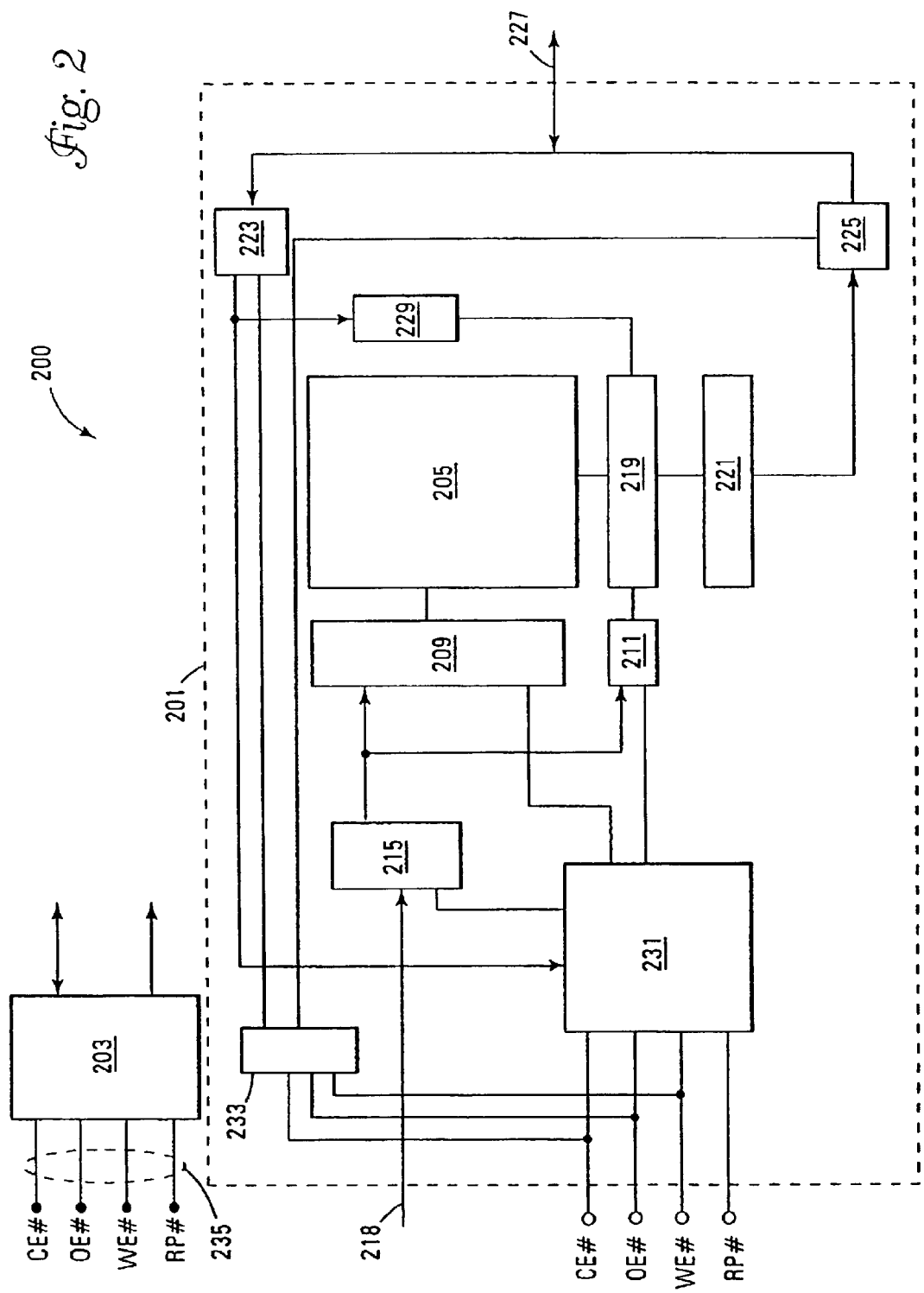

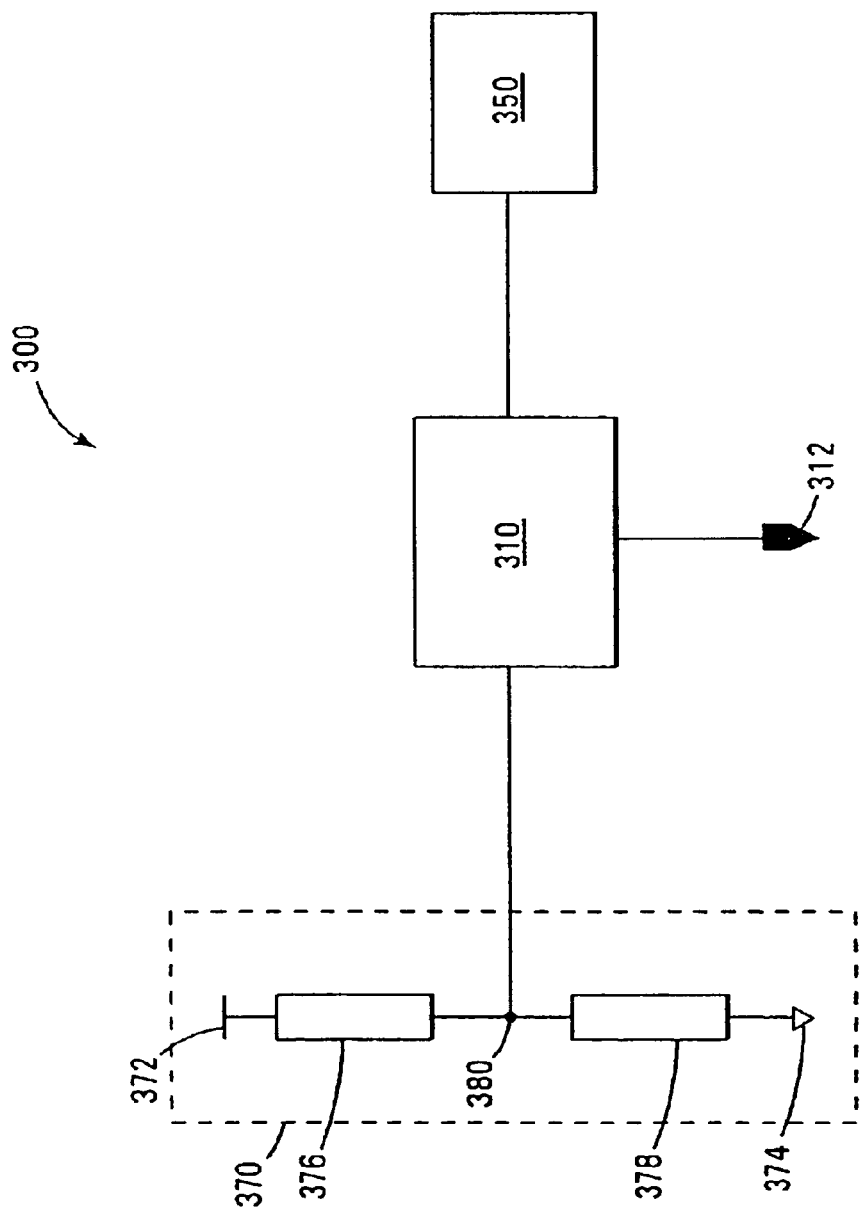

VOLTAGE AND TEMPERATURE COMPENSATED PULSE GENERATOR

STATEMENT OF RELATED APPLICATIONS

This application is a continuation of U.S. patent application Ser. No. 10/642,958, filed Aug. 18, 2003 and titled, "VOLTAGE AND TEMPERATURE COMPENSATED PULSE GENERATOR now U.S. Pat. No. 6,807,111, issued on Oct. 19, 2004," which is a divisional of U.S. patent application Ser. No. 10/032,277, filed Dec. 21, 2001 and issued Nov. 4, 2003 as U.S. Pat. No. 6,643,192, each of which is commonly assigned and incorporated by reference in its entirety herein, and which claim priority to Italian Patent Application Serial No. RM2000A000700 filed Dec. 28, 2000, which is commonly assigned.

TECHNICAL FIELD OF THE INVENTION

The present invention relates generally to semiconductor integrated circuit devices, and in particular, the present invention relates to pulse generators for developing control signals in a semiconductor memory device.

BACKGROUND OF THE INVENTION

Pulse generators are useful in a number of semiconductor integrated circuit devices to control time delays between operations or to control the length of an operation or a phase of that operation. One particular type of semiconductor integrated circuit device is a memory device.

Semiconductor memory devices are rapidly-accessible memory devices. In a semiconductor memory device, the time required for storing and retrieving information generally is independent of the physical location of the information within the memory device. Semiconductor memory devices typically store information in a large array of cells. A group of cells are electrically connected together by a bit line, or data line. An electrical signal is used to program a cell or cells.

Computer, communication and industrial applications are driving the demand for memory devices in a variety of electronic systems. One important form of semiconductor memory device includes a non-volatile memory made up of floating-gate memory cells called flash memory. Computer applications use flash memory to store BIOS firmware. Peripheral devices such as printers store fonts and forms on flash memory. Digital cellular and wireless applications consume large quantities of flash memory and are continually pushing for lower voltages and higher densities. Portable applications such as digital cameras, audio recorders, personal digital assistants (PDAs) and test equipment also use flash memory as a medium to store data.

As operating voltages continue to decrease, operation of the memory device must come under tighter constraints. Lower operating voltages lead to lower operating margins. In turn, lower operating margins require tighter controls in time-dependent operations.

Timing of operations within a memory device is often regulated by a timing pulse or other control signal generated by a pulse generator. Timing pulses having durations that are relatively stable across a wide range of operating conditions are preferred. If a timing pulse shows excessive variation across anticipated operating conditions, the designer must build in delays to avoid entering or leaving a phase of operation too early. These intentional delays degrade the potential performance of the memory device.

One common pulse generator is a ramp comparator. FIG. 1 depicts an example of a pulse generator 100 as a simple ramp comparator. Typical ramp comparators include a comparator 110 whose output is generated in response to a difference between a ramp signal from a ramp signal generator 150 and a threshold signal from a threshold signal generator 170. Such ramp comparators are often used to develop a timing pulse. The duration of the pulse is dependent upon the level of the threshold signal, the initial value of the ramp signal and the slope of the ramp signal.

For integrated circuits, the threshold signal for a ramp comparator is typically a voltage signal such as a supply voltage or some internally-generated voltage. One example of a threshold signal generator 170 is shown in FIG. 1 configured as a voltage divider. The threshold signal generator 170 is fed by a first potential node 172 on a high end and a second potential node 174 on a low end. The first potential node 172 may be coupled to receive a supply potential such as Vcc. The second potential node 174 may be coupled to receive a ground potential such as Vss. The threshold signal generator 170 has an upper resistive component 176 in series with a lower resistive component 178. The upper resistive component 176 is located between the first potential node 172 and an output node 180. The lower resistive component 178 is located between the second potential node 174 and the output node 180.

The threshold signal is provided at the output node 180. The potential level of the threshold signal is between the potential level of the first potential node 172 and the potential level of the second potential node 174 and can be adjusted through selection of the resistance values of the upper resistive component 176 and the lower resistive component 178 as is well known in the art. In general, the output of the threshold signal generator 170, $V_o$, can be described by the function, $V_o = (R_1/(R_1+R_u))*(V_h-V_1)+V_1$, where $R_1$ is the resistance of the lower resistive component 178, $R_u$ is the resistance of the upper resistive component 176, $V_h$ is the potential received at the first potential node 172, and $V_1$ is the potential received at the second potential node 174.

The ramp signal is often generated using a ramp signal generator 150 having a resistive-capacitive (RC) circuit. In the example of FIG. 1, the ramp signal generator 150 is depicted as having a resistive component 156 coupled between a first potential node 152 and an output node 160. The ramp signal generator 150 further has a capacitive component 158 coupled between a second potential node 154 and the output node 160. The ramp signal provided at the output node 160 is responsive to an input signal, such as a supply voltage from the first potential node 152. Such RC circuits are highly reliable and are easy to design and fabricate, but they are also generally sensitive to changes in the voltage level of the input signal as well as to changes in ambient temperature. A pulse generator 100 whose ramp signal is sensitive to changes in ambient temperature may exhibit unacceptable variation in timing characteristics within anticipated operating temperatures.

For the reasons stated above, and for other reasons stated below which will become apparent to those skilled in the art upon reading and understanding the present specification, there is a need in the art for alternative pulse generators exhibiting compensation for supply voltage as well as ambient temperature, memory devices containing such pulse generators, and methods of their operation.

SUMMARY OF THE INVENTION

The above-mentioned problems with memory devices and other problems are addressed by the present invention and will be understood by reading and studying the following specification.

Ramp comparator pulse generators of the various embodiments have temperature and voltage compensation and are adapted for use in integrated circuit devices such as memory devices. They are particularly adapted for low-voltage memory devices, e.g., those operating at supply voltages of 1.6–2.2V or less, where operating margins are reduced. Such pulse generators include a ramp signal generator, a threshold signal generator, and a comparator providing an output signal in response to a difference between the potential level of the threshold signal and the potential level of the ramp signal.

The pulse generators described herein utilize an adaptive threshold signal generator configured as a voltage divider and having resistive components having differing effective temperature coefficients of resistivity. The adaptive threshold signal generator has an upper resistive component and a lower resistive component coupled in series between a high potential and a low potential. The lower resistive component has an effective temperature coefficient of resistivity that is less than an effective temperature coefficient of resistivity of the upper resistive component. For ramp signal generators making use of typical RC circuits, the various embodiments exhibit similar voltage compensation and improved temperature compensation over pulse generators utilizing voltage dividers having upper and lower resistive components with substantially identical effective temperature coefficients of resistivity.

For one embodiment, the invention provides a pulse generator having a comparator whose output is generated in response to a difference between a potential level of a ramp signal from a ramp signal generator and a potential level of a threshold signal from a threshold signal generator. The threshold signal generator includes an upper resistive component coupled between a first potential node and an output node of the threshold signal generator. The threshold signal generator further includes a lower resistive component coupled between a second potential node and the output node of the threshold signal generator. The upper resistive component has a first effective temperature coefficient of resistivity and the lower resistive component has a second effective temperature coefficient of resistivity lower than the first effective temperature coefficient of resistivity.

For another embodiment, the invention provides a pulse generator having a comparator whose output is generated in response to a difference between a potential level of a ramp signal from a ramp signal generator and a potential level of a threshold signal from a threshold signal generator. The threshold signal generator includes an upper resistive component coupled between a first potential node and an output node of the threshold signal generator. The threshold signal generator further includes a lower resistive component coupled between a second potential node and the output node of the threshold signal generator. The upper resistive component has a first effective temperature coefficient of resistivity and the lower resistive component has a second effective temperature coefficient of resistivity lower than the first effective temperature coefficient of resistivity. The lower resistive component includes a bipolar junction transistor having a base coupled to the output of the threshold signal generator, a collector coupled to the output of the threshold signal generator, and an emitter. The lower resistive component further includes a resistive element coupled in parallel with the bipolar junction transistor, having an input coupled to the collector of the bipolar junction transistor and an output coupled to the emitter of the bipolar junction transistor. The lower resistive component still further includes a resistive element coupled in series with the bipolar junction transistor, having an input coupled to the emitter of the bipolar junction transistor and an output coupled to the second potential node through a selective coupling device, wherein the selective coupling device is selectively activated in response to a control signal.

For yet another embodiment, the invention provides a method of generating an output signal having a pulse duration. The method includes generating a threshold signal having a potential level, wherein the threshold signal is generated at the output of a voltage divider having an upper resistive component and a lower resistive component, and wherein the lower resistive component has an effective temperature coefficient of resistivity lower than an effective temperature coefficient of resistivity of the upper resistive component. The method further includes generating a ramp signal having a potential level and resetting the ramp signal to an initial potential level. The method still further includes generating the output signal in response to a difference between the potential level of the threshold signal and the potential level of the ramp signal. The output signal has a first logic level at the time of resetting the ramp signal, the output signal transitions to a second logic level after the ramp signal assumes the initial potential level, and the output signal transitions back to the first logic level when the potential level of the threshold signal exceeds the potential level of the ramp signal by less than a predetermined difference.

For further embodiments, the invention provides memory devices and electronic systems containing pulse generators of the type described herein. The invention further provides methods and apparatus of varying scope.

BRIEF DESCRIPTION OF THE DRAWINGS

FIG. 2 is a functional block diagram of a memory device coupled to a processor as part of an electronic system.

FIG. 3A is a schematic of a ramp comparator pulse generator having a threshold signal generator having resistive components of differing effective temperature coefficients of resistivity.

DETAILED DESCRIPTION OF THE INVENTION

Figure 1:
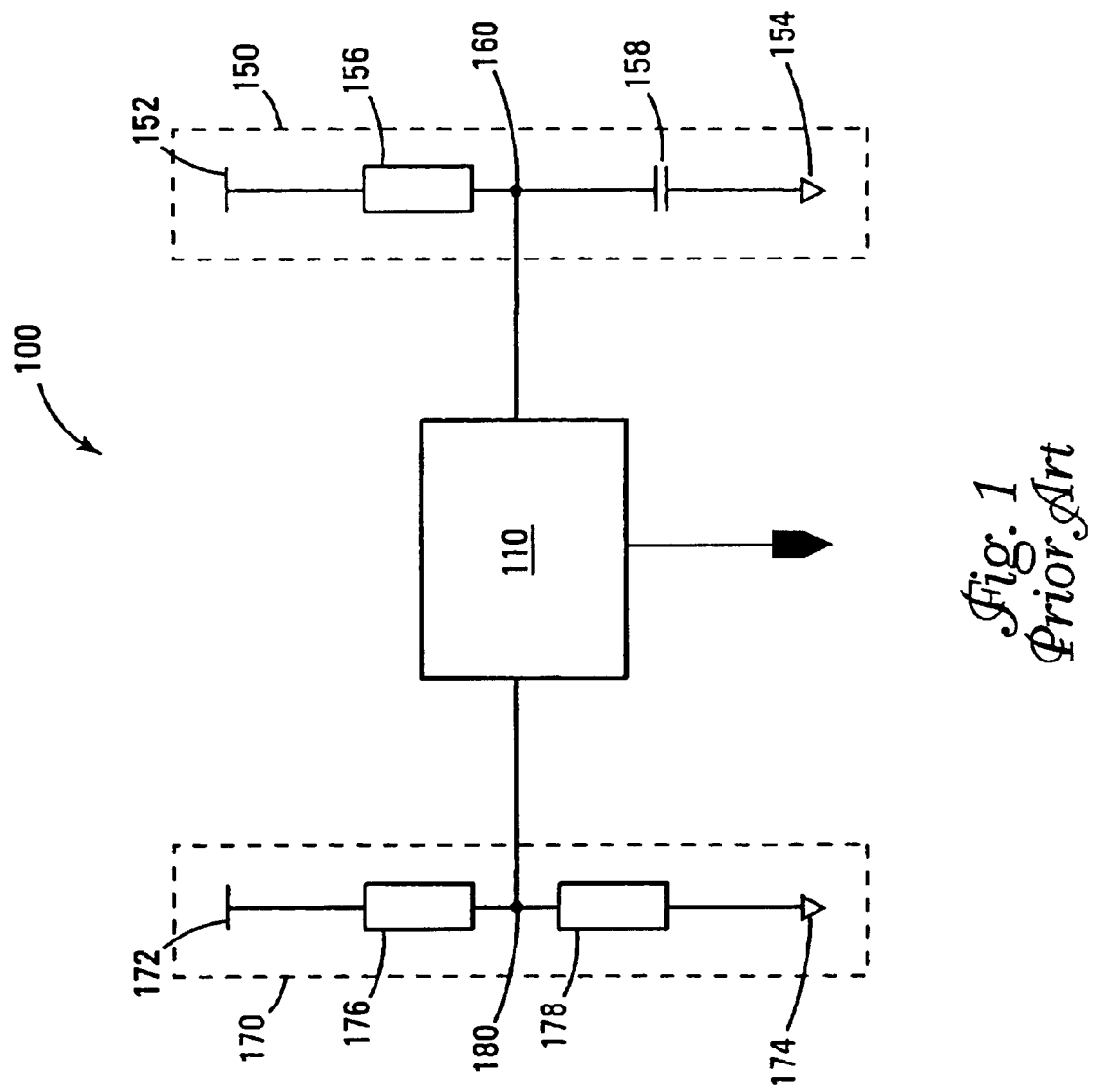
FIG. 1 is a schematic of a typical ramp comparator pulse generator.

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The term substrate used in the following description includes any base semiconductor structure. Examples include silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a substrate in the following description, previous process steps may have been utilized to form regions/junctions in the base semiconductor structure, and the term substrate includes the underlying layers containing such regions/junctions. The following detailed description is, therefore, not to be taken in a limiting sense, and the scope of the present invention is defined only by the appended claims and equivalents thereof.

Pulse generators in accordance with the various embodiments are adaptable for a variety of integrated circuit devices. One such integrated circuit device is a memory device, such as a flash memory device. FIG. 2 is a functional block diagram of a basic flash memory device 201 that is coupled to a processor 203. The memory device 201 and the processor 203 may form part of a larger electronic system 200. The memory device 201 has been simplified to focus on features of the memory that are helpful in understanding the present invention. The memory device 201 includes an array of memory cells 205. The memory cells are preferably non-volatile floating-gate memory cells and generally have their gates coupled to word lines, drain regions coupled to local bit lines, and source regions commonly coupled to a ground potential. The memory array 205 is arranged in rows and columns, with the rows arranged in blocks. The memory cells generally can be erased in blocks. Data, however, may be stored in the memory array 205 separate from the block structure.

A row decoder 209 and a column decoder 211 are provided to decode address signals provided on address lines A0–Ax 213. An address buffer circuit 215 is provided to latch the address signals. Address signals are received and decoded to access the memory array 205. A column select circuit 219 is provided to select a column of the memory array 205 in response to control signals from the column decoder 211. Sensing circuitry 221 is used to sense and amplify data stored in the memory cells. Data input 223 and output 225 buffer circuits are included for bi-directional data communication over a plurality of data (DQ) lines 227 with the processor 203. A data latch 229 is typically provided between data input buffer circuit 223 and the DQ lines 227 for storing data values (to be written to a memory cell) received from the DQ lines 227. Data amplified by the sensing circuitry 221 is provided to the data output buffer circuit 225 for output on the DQ lines 227.

Command control circuit 231 decodes signals provided on control lines 235 from the processor 203. These signals are used to control the operations on the memory array 205, including data read, data write, and erase operations. The command control circuit 231 includes a pulse generator in accordance with the various embodiments described herein. Input/output control circuit 233 is used to control the data input buffer circuit 223 and the data output buffer circuit 225 in response to some of the control signals. As stated above, the flash memory device 201 has been simplified to facilitate a basic understanding of the features of the memory. A more detailed understanding of flash memories is known to those skilled in the art.

As noted above, pulse generators of the type depicted in FIG. 1 may have unacceptable variation due to changes in ambient temperature. Such variation is generally the result of resistance changes in the resistive component of the ramp generator. Resistance is partly a function of temperature such that the resistance of a resistive component at a first temperature is different compared to the resistance of the resistive component at a second temperature. The function can be described generally as $R_2 = R_1 * (1 + \alpha * (T_2 - T_1))$, where $T_1$ is the first temperature, $T_2$ is the second temperature, $R_1$ is the resistance at $T_1$, $R_2$ is the resistance at $T_2$ and $\alpha$ is the temperature coefficient of resistivity of the resistive component. While resistance changes would also occur in the voltage divider of the threshold generator, voltage dividers are generally immune from temperature variation as their output is determined by the ratio of the resistance of the upper resistive component to the lower resistive component; as long as both resistive components have the same temperature coefficient of resistivity, the ratio will remain substantially constant across normal temperature ranges.

Integrated circuit resistive components are generally fabricated using semiconductor resistors as their resistive elements. Semiconductor resistors use the bulk resistivity of doped semiconductor regions to obtain a desired resistance value. Semiconductor resistors fall generally into four classes: diffused, bulk, pinched and implanted. Semiconductor resistors of the diffused class rely on the resistivity of a diffused region in a semiconductor substrate to provide the resistance value. Semiconductor resistors of the bulk class rely on the bulk resistivity of a semiconductor material to provide the resistance value. Semiconductor resistors of the pinched class utilize a doped semiconductor region whose effective cross-sectional area has been "pinched" between doped areas of an opposite conductivity type to provide the resistance value. Semiconductor resistors of the implanted class rely on the resistivity of a shallow implanted region in a semiconductor substrate to provide the resistance value. For each class of semiconductor resistor, its typical temperature coefficient of resistivity, $\alpha$, is some positive value for typical operating temperatures. Accordingly, increases in ambient temperature generally lead to increased resistance levels.

Increasing resistance levels in the RC circuit of the ramp generator will lead to a decreasing slope of the ramp signal. If the threshold signal remains substantially constant, a decreasing slope of the ramp signal will lead to a larger pulse width from the comparator as it will take longer for the ramp signal to equal or exceed the threshold signal. To compensate for this undesirable temperature variation in the ramp signal generator, embodiments of pulse generators described herein utilize a threshold signal generator that is adaptive to changes in ambient temperature.

FIG. 3A is a schematic of one embodiment of a pulse generator 300 having a comparator 310, a ramp signal generator 350 and an adaptive threshold signal generator 370. The comparator 310 is coupled to receive a ramp signal from the ramp signal generator 350 and a threshold signal from the adaptive threshold signal generator 370. A control signal is generated by the comparator 310 in response to the ramp signal and the threshold signal for output on node 312 as the output signal of the pulse generator 300.

The adaptive threshold signal generator 370 of FIG. 3A includes an upper resistive component 376 coupled between a first potential node 372 and an output node 380. The adaptive threshold signal generator 370 of FIG. 3A further includes a lower resistive component 378 coupled between a second potential node 374 and the output node 380. The first potential node 372 is coupled to receive a first potential and the second potential node 374 is coupled to receive a second potential, with the first potential higher than the second potential. For one embodiment, the first potential node 372 is coupled to receive a supply potential, such as Vcc, and the second potential node 374 is coupled to receive a ground potential, such as Vss.

To compensate for the effects of a positive effective temperature coefficient of resistivity of a resistive component of the ramp signal generator 350, the adaptive threshold signal generator 370 has a lower resistive component 378 having an effective temperature coefficient of resistivity that is lower than an effective temperature coefficient of resistivity of the upper resistive component 376. In this manner, increasing temperatures will raise the resistance of the upper resistive component 376 faster than the resistance of the lower resistive component 378. As the ratio of the resistance of the upper resistive component 376 to the resistance of the lower resistive component 378 increases, the resulting threshold signal will decrease for a given first and second potentials. A decreasing threshold signal will tend to compensate for a decreasing ramp signal slope. Using such compensation, a length of time needed for the ramp signal to exceed the threshold signal at a first temperature can be made to approach a length of time needed for the ramp signal to exceed the threshold signal at a second temperature, thus facilitating a more consistent pulse duration of the control signal across a range of operating temperatures.

It is noted that were the ramp signal generator 350 to have a negative effective temperature coefficient of resistivity, increasing temperatures would result in an increasing ramp signal slope. The threshold generator 370 could similarly compensate for the effects of this negative effective temperature coefficient of resistivity by reversing the roles of the first potential node 372 and the second potential node 374 such that the first potential is lower than the second potential. Again, increasing temperatures will raise the resistance of the upper resistive component 376 faster than the resistance of the lower resistive component 378. However, with the second potential higher than the first potential, the increasing ratio of the resistance of the upper resistive component 376 to the resistance of the lower resistive component 378 results in an increasing threshold signal for a given first and second potentials. An increasing threshold signal will tend to compensate for an increasing ramp signal slope.

Figure 3B:
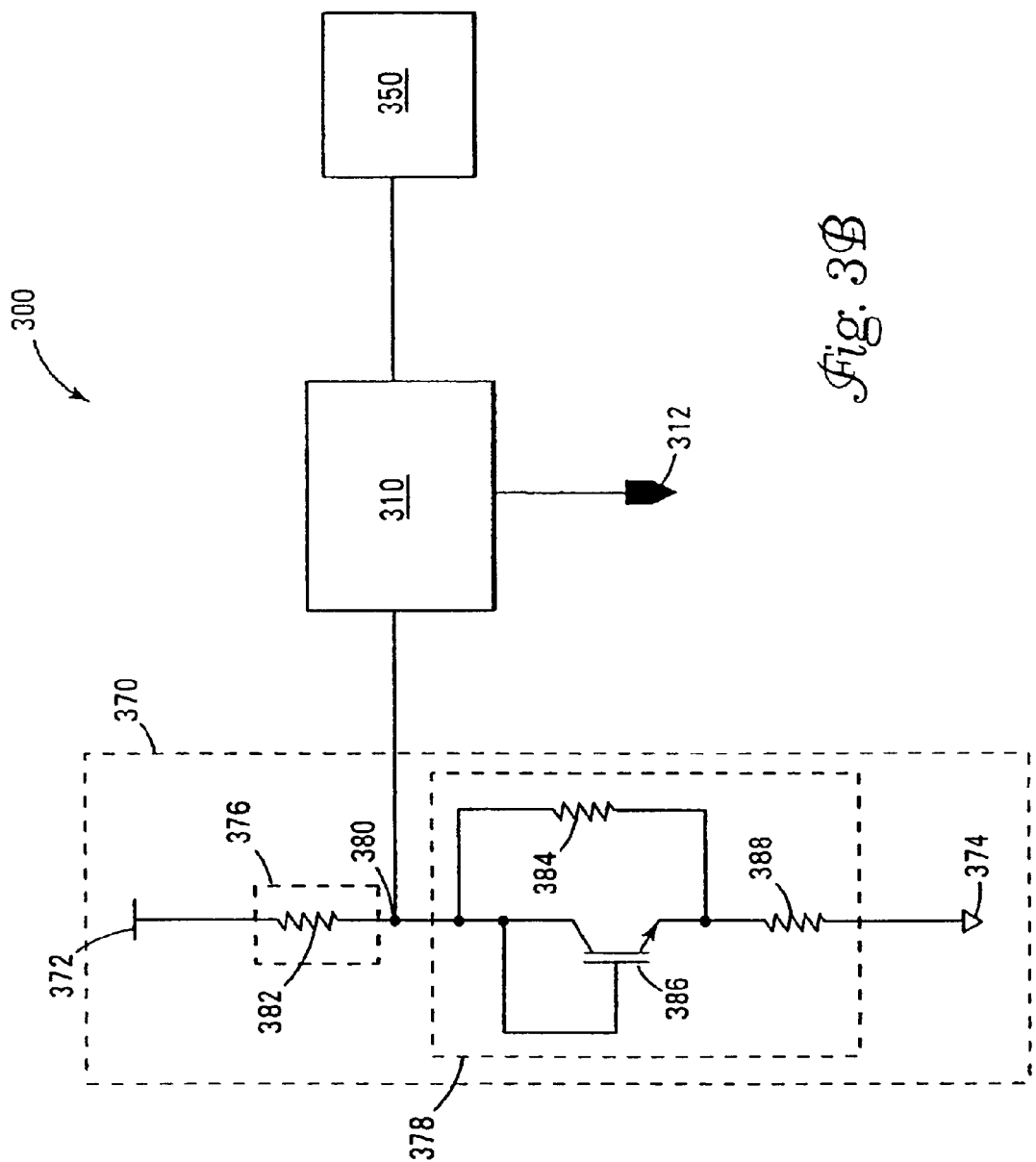
FIG. 3B is a schematic of another ramp comparator pulse generator having a threshold signal generator having resistive components of differing effective temperature coefficients of resistivity.

FIG. 3B is a schematic of another embodiment of a pulse generator 300 having a comparator 310, a ramp signal generator 350 and an adaptive threshold signal generator 370. FIG. 3B demonstrates one approach to generating an upper resistive component 376 having an effective temperature coefficient of resistivity higher than the lower resistive component 378.

The adaptive threshold signal generator 370 of FIG. 3B includes an upper resistive component 376 coupled between a first potential node 372 and an output node 380. The upper resistive component 376 of FIG. 3B includes a resistive element 382. As is well known in the art, resistive elements or resistors may be configured in a variety of parallel configurations, series configuration, or combination parallel/series configurations to produce equivalent resistive elements. Accordingly, for additional embodiments, the resistive element 382 may represent two or more resistive elements in a variety of parallel, series, or parallel/series configurations. For one embodiment, the resistive element 382 contains one or more semiconductor resistors and the upper resistive component 376 has a positive temperature coefficient of resistivity.

The upper resistive component 376 has an effective temperature coefficient of resistivity that is the composite of the temperature coefficients of resistivity of all of its resistive elements. For the embodiment depicted in FIG. 3B, the effective temperature coefficient of resistivity of the upper resistive component 376 equals the temperature coefficient of resistivity of the resistive element 382.

The adaptive threshold signal generator 370 of FIG. 3B further includes a lower resistive component 378 coupled between a second potential node 374 and the output node 380. The first potential node 372 is coupled to receive a first potential and the second potential node 374 is coupled to receive a second potential, with the first potential higher than the second potential. For one embodiment, the first potential node 372 is coupled to receive a supply potential, such as Vcc, and the second potential node 374 is coupled to receive a ground potential, such as Vss.

The lower resistive component 378 has an effective temperature coefficient of resistivity that is lower than the effective temperature coefficient of resistivity of the upper resistive component 376. To accomplish this, the lower resistive component 378 includes at least one resistive element having a temperature coefficient of resistivity lower than the effective temperature coefficient of resistivity of the upper resistive component 376. For one embodiment, the lower resistive component 378 includes at least one resistive element having a temperature coefficient of resistivity lower than the lowest temperature coefficient of resistivity of any resistive element of the upper resistive component 376. For another embodiment, the lower resistive component 378 includes at least one resistive element having a negative temperature coefficient of resistivity.

For the embodiment depicted in FIG. 3B, the lower resistive component 378 includes, as a resistive element, a bipolar junction transistor (BJT) 386 having its base coupled to its collector. The BJT 386 has a negative temperature coefficient of resistivity. As an example, the base-emitter bias, Vbe, of an npn BJT may change by $-0.2$ mV/° C. in this configuration. Additional resistive elements, such as resistive elements 384 and 388 can be used to adjust the nominal resistance level of the lower resistive component 378 to produce a desired resistance ratio between the upper resistive component 376 and the lower resistive component 378, and thus to produce a desired threshold signal for a given set of first and second potentials. For the embodiment depicted in FIG. 3B, resistive element 384 is coupled in parallel with BJT 386 while resistive element 388 is coupled in series with BJT 386. For one embodiment, the resistive elements 384 and 388 each contain semiconductor resistors, each having a positive temperature coefficient of resistivity. As with the resistive element 382, resistive elements 384 and 388 may each represent one or more resistive elements in a variety of parallel configurations, series configurations, or combination parallel/series configurations.

Figure 3C:
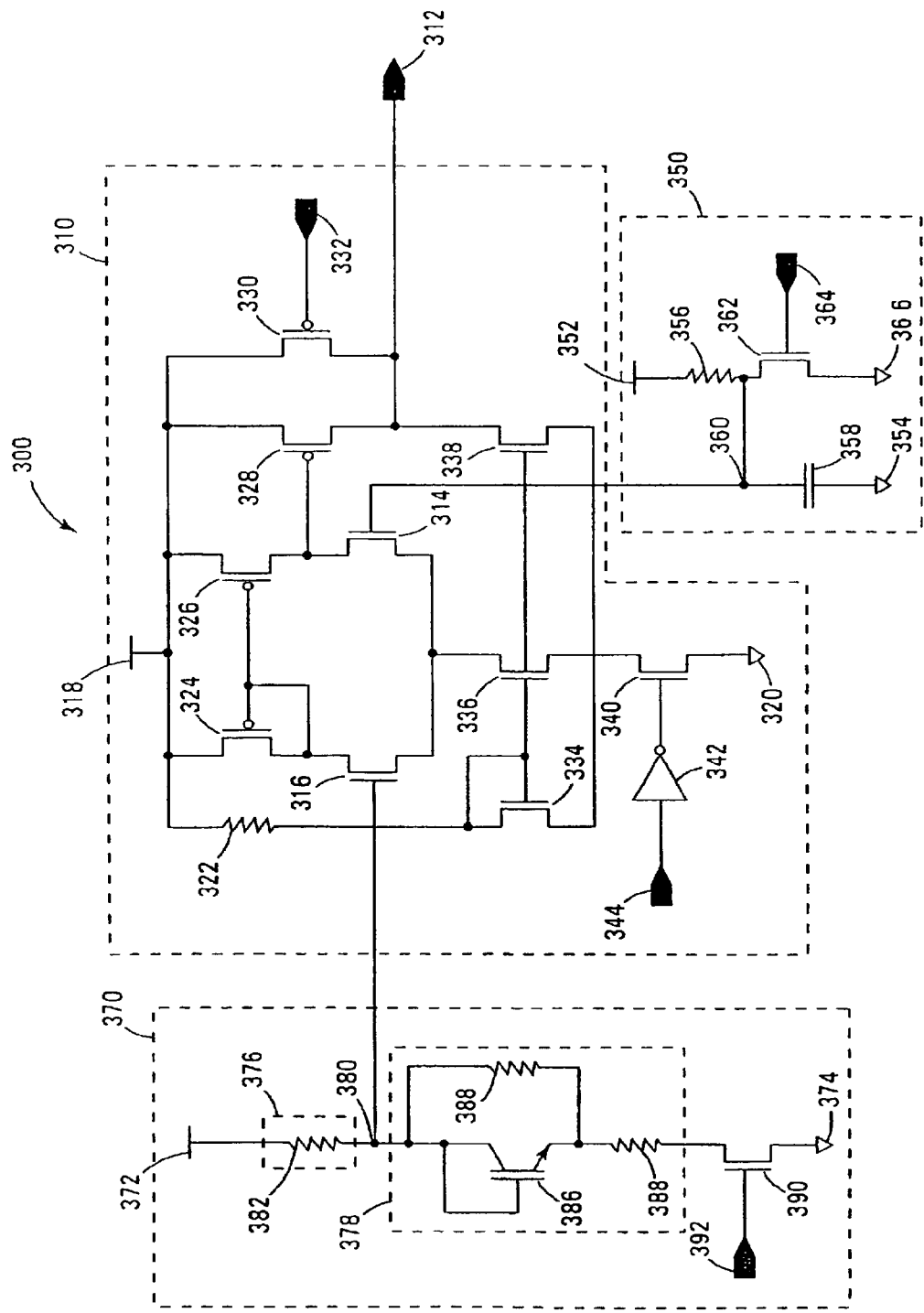
FIG. 3C is a schematic of yet another ramp comparator pulse generator having a threshold signal generator having resistive components of differing effective temperature coefficients of resistivity.

FIG. 3C is a schematic of yet another embodiment of a pulse generator 300 having a comparator 310, a ramp signal generator 350 and an adaptive threshold signal generator 370. FIG. 3C provides detail of one embodiment of a comparator 310 and ramp signal generator 350 and will be used to describe the generation of a control signal having a pulse duration. The adaptive threshold signal generator 370 of FIG. 3C is generally similar to that shown in FIG. 3B with the addition of an n-channel field-effect transistor (nFET) 390 coupled between the lower resistive component 378 and the second potential node 374. As shown in FIG. 3C, the nFET 390 has a first source/drain region coupled to the lower resistive component 378, a second source/drain region coupled to the second potential node 374, and a gate coupled to receive a control signal on node 392. The control signal supplied to node 392 will be referred to as enable signal EN. The nFET 390 is normally deactivated or open, thereby disabling generation of the threshold signal and maintaining the potential level at the output node 380 substantially at the level of the first potential node 372. When activated or closed, the nFET 390 enables the threshold signal generator 370 to generate the threshold signal at a level between the first potential and the second potential.

The ramp signal generator 350 of FIG. 3C includes a resistive element 356 coupled between a first potential node 352 and an output node 360. The ramp signal generator 350 further includes an nFET 362 having a first source/drain region coupled to the output node 360, a second source/drain region coupled to a second potential node 366, and a gate coupled to receive a control signal on node 364. The ramp signal generator 350 still further includes a capacitive element 358 coupled between the output node 360 and a third potential node 354. The first potential node 352 is coupled to receive a first potential, the second potential node 366 is coupled to receive a second potential lower than the first potential, and the third potential node 354 is coupled to receive a third potential lower than the first potential. For one embodiment, the first potential node 352 of the ramp signal generator 350 is coupled to receive the same potential as the first potential node 372 of the adaptive threshold signal generator 370, e.g., the supply potential Vcc. For a further embodiment, the second potential node 366 and the third potential node 354 of the ramp signal generator 350 are each coupled to receive the same potential. For a still further embodiment, the second potential node 366 and the third potential node 354 of the ramp signal generator 350 are each coupled to receive the same potential as the second potential node 374 of the adaptive threshold signal generator 370, e.g., the ground potential Vss.

The control signal supplied to node 364 will be referred to as ramp enable signal IN1. The nFET 362 is normally deactivated or open, thereby enabling the ramp signal generator 350 to charge the capacitive element 358 and generate the ramp signal.

The comparator 310 of FIG. 3C includes a first nFET 314 having its gate coupled to receive the ramp signal and a second nFET 316 having its gate coupled to receive the threshold signal. The comparator 310 further includes bypass p-channel field-effect transistor (pFET) 330. Bypass pFET 330 has a first source/drain region coupled to receive a supply potential from potential node 318, a second source/drain region coupled to the output 312 of the comparator 310, and a gate coupled to receive the enable signal EN on node 332. The nFET 340 has a first source/drain region coupled to receive a ground potential from the potential node 320, a second source/drain region, and a gate coupled to receive an enable signal EN_ on node 344 through an inverter 342. The enable signal EN_ is a binary complement of the enable signal EN such that the gate of the nFET 340 effectively receives the enable signal EN.

The comparator 310 further includes an nFET 334 having a first source/drain region, a gate coupled to its first source/drain region, and a second source/drain region coupled to the first source/drain region of nFET 340. The resistor 322 is coupled between the potential node 318 and the first source/drain region of nFET 334. The nFET 336 includes a gate coupled to the gate of the nFET 344, a first source/drain region coupled to second source/drain regions of nFETs 314 and 316, and a second source/drain region coupled to the first source/drain region of nFET 340. The nFET 338 includes a gate coupled to the gate of the nFET 344, a first source/drain region coupled to the output 312, and a second source/drain region coupled to the first source/drain region of the nFET 340. The pFET 328 includes a gate coupled to a first source/drain region of the nFET 314, a first source/drain region coupled to the potential node 318, and a second source/drain region coupled to the output 312. The pFET 324 includes a gate coupled to a first source/drain region of the nFET 316, a first source/drain region coupled to the potential node 318, and a second source/drain region coupled to the first source/drain region of the nFET 316. The pFET 326 includes a gate coupled to the gate of the pFET 324, a first source/drain region coupled to the potential node 318, and a second source/drain region coupled to the first source/drain region of the nFET 314.

During a first phase of operation of the pulse generator 300, the enable signal EN has a first logic level, such as logic low, thereby concurrently deactivating the nFET 390 of the threshold signal generator 370, activating the pFET 330 of the comparator 310, and deactivating the nFET 340 of the comparator 310. In this manner, the control signal on the output 312 of the comparator 310 has a first logic level during the first phase of operation. The first logic level of the comparator 310 is represented by a potential level substantially at the value of the supply potential provided at node 318. During the first phase of operation of the pulse generator 300, the ramp enable signal IN1 may have a logic low level, thereby deactivating the nFET 362 and charging the capacitive element 358, thus bringing the ramp signal to a potential level of the potential node 352.

During a second phase of operation of the pulse generator 300, the enable signal EN is transitioned to a second logic level, such as logic high. The ramp enable signal IN1 may remain at its logic low level. In response to the transition of the enable signal EN to the logic high level, nFET 390 is activated, nFET 340 is activated, and pFET 330 is deactivated, thereby enabling the comparator 310 to generate an output signal in response to a difference between the potential level of the threshold signal and the potential level of the ramp signal. For the embodiment depicted in FIG. 3C, the ramp signal will have the potential level of the potential node 352 at the initiation of this second phase of operation as the capacitive element 358 will be fully charged during the first phase of operation. The threshold signal will fall from a potential level of the potential node 372 to a potential level between a first potential received at the potential node 372 and a second potential received at the potential node 374. As such, the potential level of the threshold signal will be less than the potential level of the ramp signal at the initiation of the second phase of operation and the logic level of the output signal of the pulse generator 300 will remain at its first, high, logic level.

At the beginning of a third phase of operation of the pulse generator 300, the ramp enable signal IN1 is briefly pulsed to a second or high logic level to reset the ramp signal. The output signal of the pulse generator 300 has the first logic level at the time of resetting the ramp signal. In response to the pulse of the ramp enable signal IN1 to a logic high level, the capacitive element 358 is shorted to a ground potential and consequently discharged. This effectively shorts the ramp signal to the ground potential. For consistent operation, the pulse is of some duration sufficient to completely discharge the capacitive element 358 and bring the ramp signal down to the ground potential, yet brief enough to be a minor fraction of the desired pulse duration of the output signal of the pulse generator 300. For one embodiment, the pulse is equal to one-half of a clock cycle. For a further embodiment, the pulse is approximately 5 nS.

After the ramp signal is brought to the ground potential as an initial potential level, the potential level of the threshold signal will exceed the potential level of the ramp signal and the output signal of the pulse generator 300 will transition to a second or logic low level. As the capacitive element 358 charges, the potential level of the ramp signal will rise from its initial value. The output signal of the pulse generator 300 will maintain its logic low level until the potential level of the threshold signal exceeds the potential level of the ramp signal by less than some predetermined difference. This predetermined difference is determined by the configuration and fabrication of the comparator 310 and represents the potential differential between the threshold signal applied to the gate of the nFET 316 and the ramp signal applied to the gate of the nFET 314 necessary to cause the output signal on output 312 to transition back to the logic high level. The predetermined difference need not be constant over a variety of operating conditions, but should be substantially constant or repeatable for a given set of operating conditions. For one embodiment, the predetermined difference is approximately zero such that the output signal of the pulse generator 300 will transition to the logic high level when the potential level of the ramp signal crosses the potential level of the threshold signal. For another embodiment, the predetermined difference is approximately −50 mV such that the output signal of the pulse generator 300 will transition to the logic high level when the potential level of the ramp signal exceeds the potential level of the threshold signal by approximately 50 mV.

During the third phase of operation, the ramp signal will ramp toward the potential level of the potential node 352, i.e., the supply potential. When the ramp signal reaches a potential level such that the potential level of the threshold signal exceeds the potential level of the ramp signal by less than the predetermined difference, the output signal of the pulse generator 300 will transition back to the logic high level. The output signal of the pulse generator 300 generated in accordance with the foregoing description will have a pulse duration measured as the time between the transition to the logic low level and the transition back to the logic high level during the third phase of operation.

The third phase of operation, and thus the generation of the ramp enable signal pulse, may substantially coincide with the second phase of operation or it may be delayed from the beginning of the second phase of operation to allow the threshold signal to stabilize. As control signals transition, spikes may be induced on the resulting output signals. These spikes may lead to a false indication that the difference between the potential level of the threshold signal and the potential level of the ramp signal is greater than the predetermined difference, thus resulting in a transition of the output signal of the pulse generator 300 to the logic low level. Delaying the generation of the ramp enable signal pulse reduces the risk of creating an erroneous output signal of the pulse generator 300. For one embodiment, the third phase of operation is delayed by one clock cycle. For a further embodiment, the third phase of operation is delayed by approximately 10 nS.

Subsequent to the transition of the output signal of the pulse generator 300 back to the logic high level during the third phase of operation, the pulse generator 300 may be returned to the first phase of operation in preparation for the next pulse. The duration of the pulse of the output signal of the pulse generator 300 exhibits compensation for changes in supply potential and changes in ambient temperature. Changes in supply potential are compensated for using an adaptive threshold signal generator 370 configured as a voltage divider having an upper resistive component 376 and a lower resistive component 378 coupled in series between a supply potential and a ground potential. Changes in ambient temperature are compensated for by using resistive components in the adaptive threshold signal generator 370 having different effective temperature coefficients of resistivity. In compensating for a positive effective temperature coefficient of resistivity of the ramp signal generator 350, the lower resistive component 378 has an effective temperature coefficient of resistivity that is less than the effective temperature coefficient of resistivity of the upper resistive component 376.

Conclusion

Ramp comparator pulse generators have been described for the generation of a pulse having temperature and voltage compensation. Such pulse generators include a ramp signal generator, a threshold signal generator, and a comparator providing an output signal in response to a difference between the potential level of the threshold signal and the potential level of the ramp signal. The pulse generators described herein utilize an adaptive threshold signal generator configured as a voltage divider and having resistive components having differing effective temperature coefficients of resistivity. The adaptive threshold signal generator has an upper resistive component and a lower resistive component coupled in series between a high potential and a low potential. The lower resistive component has an effective temperature coefficient of resistivity that is less than an effective temperature coefficient of resistivity of the upper resistive component. For ramp signal generators making use of typical RC circuits, the various embodiments exhibit similar voltage compensation and improved temperature compensation over pulse generators utilizing voltage dividers having upper and lower resistive components with substantially identical effective temperature coefficients of resistivity.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A pulse generator having a comparator whose output is generated in response to a difference between a potential level of a ramp signal and a potential level of a threshold signal from a threshold signal generator, wherein the threshold signal generator comprises:

a voltage divider having an output coupled between an upper resistive component and a lower resistive component;

wherein the upper resistive component is coupled between a first potential node and the output node of the voltage divider, wherein the first potential node is coupled to receive a first potential;

wherein the lower resistive component is coupled between a second potential node and the output node of the voltage divider, wherein the second potential node is coupled to receive a second potential; and wherein a resistance of the upper resistive component increases faster in response to increasing ambient temperature than does a resistance of the lower resistive component.

2. The pulse generator of claim 1, wherein the second potential is lower than the first potential.

3. The pulse generator of claim 1, wherein the second potential is higher than the first potential.

4. The pulse generator of claim 3, Wherein the lower resistive component includes at least one resistive element having a negative temperature coefficient of resistivity.

5. The pulse generator of claim 2, wherein the upper resistive component has a positive effective temperature coefficient of resistivity.

6. The pulse generator of claim 5, wherein the lower resistive component has a positive effective temperature coefficient of resistivity.

7. The pulse generator of claim 6, wherein the lower resistive component includes at least one resistive element having a temperature coefficient of resistivity lower than each resistive element of the upper resistive component.

8. The pulse generator of claim 7, wherein the lower resistive component includes at least one resistive element having a negative temperature coefficient of resistivity.

9. The pulse generator of claim 2, wherein the lower resistive component includes a bipolar junction transistor having a base coupled to the output node of the voltage divider, a collector coupled to the output node of the voltage divider, and an emitter.

10. The pulse generator of claim 9, further comprising at least one resistive element coupled in parallel with the bipolar junction transistor.

11. The pulse generator of claim 8, further comprising at least one resistive element coupled in series with the bipolar junction transistor.

12. A pulse generator having a comparator whose output is generated in response to a difference between a potential level of a ramp signal and a potential level of a threshold signal from an output node of a voltage divider, wherein the voltage divider comprises:
an upper resistive component coupled between a first potential node and the output node of the voltage divider, wherein the first potential node is coupled to receive a first potential; and
a lower resistive component coupled between a second potential node and the output node of the voltage divider, wherein the second potential node is coupled to receive a second potential lower than the first potential;
wherein a resistance of the upper resistive component increases faster in response to increasing ambient temperature than does a resistance of the lower resistive component; and
wherein effective temperature coefficients of resistivity of the upper and lower resistive components are both positive.

13. The pulse generator of claim 12, wherein the lower resistive component includes at least one resistive element having a temperature coefficient of resistivity lower than any resistive element of the upper resistive component.

14. The pulse generator of claim 13, wherein the lower resistive component includes at least one resistive element having a negative temperature coefficient of resistivity.

15. The pulse generator of claim 12, wherein the lower resistive component includes a bipolar junction transistor having a base coupled to the output node of the voltage divider, a collector coupled to the output node of the voltage divider, and an emitter.

16. The pulse generator of claim 15, further comprising at least one resistive element coupled in parallel with the bipolar junction transistor.

17. The pulse generator of claim 14, further comprising at least one resistive element coupled in series with the bipolar junction transistor.

18. A method of generating an output signal having a pulse duration, the method comprising:
generating a ramp signal having a potential level, wherein a slope of the ramp signal decreases with increases in ambient temperature;
generating a threshold signal having a potential level, wherein the potential level of the threshold signal decreases with increases in ambient temperature;
comparing the potential level of the ramp signal to the potential level of the threshold signal; and
generating the output signal in response to a difference between the potential level of the threshold signal and the potential level of the ramp signal;
wherein the output signal has a first logic level when the ramp signal has an initial potential level; and
wherein the output signal transitions to a second logic level when the difference between the potential level of the threshold signal and the potential level of the ramp signal is less than a predetermined value.

19. The method of claim 18, wherein generating the threshold signal further comprises generating the threshold signal at an output of a voltage divider interposed between an upper resistive component and a lower resistive component, wherein a resistance of the upper resistive component increases faster in response to increasing ambient temperature than does a resistance of the lower resistive component.

20. The method of claim 19, wherein the lower resistive component includes at least one resistive element having a temperature coefficient of resistivity lower than the effective temperature coefficient of resistivity of the upper resistive component.

21. The method of claim 19, wherein the lower resistive component includes at least one resistive element having a negative temperature coefficient of resistivity.

22. The method of claim 21, wherein the at least one resistive element having a negative temperature coefficient of resistivity is a bipolar junction transistor.

23. The method of claim 19, wherein the lower resistive component includes at least one resistive element coupled in parallel with a bipolar junction transistor and at least one resistive element coupled in series with the bipolar junction transistor.

24. A memory device, comprising:
an array of memory cells;
a command control circuit for generating control signals to control operations on the array of memory cells, the command control circuit including a pulse generator having a comparator whose output is generated in response to a difference between a potential level of a ramp signal and a potential level of a threshold signal generated at an output node of a voltage divider, wherein the voltage divider comprises:
an upper resistive component coupled between a first potential node and the output node of the voltage divider, wherein the first potential node is coupled to receive a first potential; and
a lower resistive component coupled between a second potential node and the output node of the voltage divider, wherein the second potential node is coupled to receive a second potential;
wherein a resistance of the upper resistive component increases faster in response to increasing ambient temperature than does a resistance of the lower resistive component.

25. An electronic system, comprising:

a processor;

a memory device coupled to the processor, wherein the memory device includes a memory array and a command control circuit for generating control signals to control operations on the memory array, the command control circuit including a pulse generator having a comparator whose output is generated in response to a difference between a potential level of a ramp signal and a potential level of a threshold signal from a threshold signal generator, and wherein the threshold signal generator comprises:

a voltage divider having an output coupled between an upper resistive component and a lower resistive component;

wherein the upper resistive component is coupled between a first potential node and the output node of the voltage divider, wherein the first potential node is coupled to receive a first potential;

wherein the lower resistive component is coupled between a second potential node and the output node of the voltage divider, wherein the second potential node is coupled to receive a second potential; and wherein a resistance of the upper resistive component increases faster in response to increasing ambient temperature than does a resistance of the lower resistive component.

* * * * *